(12) United States Patent
Scott

(10) Patent No.: US 6,765,825 B1
(45) Date of Patent: Jul. 20, 2004

(54) DIFFERENTIAL NOR MEMORY CELL HAVING TWO FLOATING GATE TRANSISTORS

(75) Inventor: Greg Scott, Inkom, ID (US)

(73) Assignee: AMI Semiconductor, Inc., Pocatello, ID (US)

( * ) Notice: Subject to any disclaimer, the term of this patent is extended or adjusted under 35 U.S.C. 154(b) by 0 days.

(21) Appl. No.: 10/387,824

(22) Filed: Mar. 12, 2003

(51) Int. Cl.$^7$ .............................................. G11C 16/04
(52) U.S. Cl. ........................... 365/185.01; 365/185.05; 365/185.17
(58) Field of Search ...................... 365/185.01, 185.05, 365/185.17

(56) References Cited

U.S. PATENT DOCUMENTS

| | | | |
|---|---|---|---|
| 5,028,810 A | * 7/1991 | Castro et al. | 365/185.03 |
| 6,317,364 B1 | * 11/2001 | Guterman et al. | 365/185.01 |
| 6,358,799 B2 | 3/2002 | Odanaka et al. | 438/267 |
| 6,384,448 B1 | 5/2002 | Forbes | 257/315 |
| 6,384,664 B1 | 5/2002 | Hellums et al. | 327/525 |
| 6,385,108 B2 | 5/2002 | Morzano | 365/207 |

* cited by examiner

Primary Examiner—Huan Hoang
(74) Attorney, Agent, or Firm—Workman Nydegger

(57) ABSTRACT

An EEPROM memory cell that includes two floating gate transistors. Each of the drain terminals of the transistors is coupled to a corresponding differential bit line. The source terminal of both transistors are coupled to a common current source or sink. Each of the control gate terminals are coupled to a corresponding word line, which may be the same as or different than the corresponding word line that the other control terminal is connected to. The floating gate transistor may be five-terminal devices that include an additional well terminal. In that case, a different set of bit lines is used to program the EEPROM memory cell as are used to read the EEPROM memory cell. While the drain terminals are coupled to the differential read bit lines, each of the well terminals is coupled to a corresponding differential program bit line.

20 Claims, 8 Drawing Sheets

DIFFERENTIAL NOR MEMORY CELL HAVING TWO FLOATING GATE TRANSISTORS

BACKGROUND OF THE INVENTION

1. The Field of the Invention

The present invention relates to Electrically-Erasable and Programmable Read-Only-Memories (EEPROMs), and more specifically, to a differential NOR memory cell having two floating gate transistors.

2. Background and Related Art

Computing technology has revolutionized the way people work and play and has contributed enormously to the advancement of humankind. Computing technology is largely enabled by various integrated circuit designs. An important function of any computing device is the ability to store information. Non-volatile memories, in particular, retain data long-term despite a loss of power, which is advantageous for certain data.

One type of non-volatile memory circuit is often referred to as an Electrically-Erasable and Programmable Read-Only Memory (EEPROM), which functions for the most part as a Read-Only Memory except that is has the ability to be programmed and erased multiple times over the life of the memory circuit. The principle component of an EEPROM memory is the floating gate transistor. A floating gate transistor is similar to a conventional field-effect transistor, in that the floating gate transistor is a four terminal device that includes a source terminal, a drain terminal, a body terminal and a control gate terminal. The control gate terminal is capacitively coupled to the substrate between source and drain terminals such that when appropriate voltages are applied to the control gate, a channel inversion layer forms and electrically connects the source and drain thereby allowing charge carriers to flow.

However, unlike conventional field-effect transistors, the floating gate transistor includes a floating gate that is disposed between and capacitively coupled to the control gate terminal and the channel region of the substrate between the source and drain terminals. The floating gate may be programmed with a logical one (or zero) by injecting or tunneling charge carriers onto the floating gate through conventional processes such as Fowler-Nordheim tunneling or Channel Hot Electron Injection. The floating gate may be erased by tunneling carriers from the floating gate back into the substrate. The floating gate may be programmed and erased multiple times.

The amount of charge on the floating gate changes the voltage required on the control gate in order for significant conduction to occur between the source and drain. This voltage is often referred to as the "threshold voltage") of the device. A logical one or zero may be read from the EEPROM by taking advantage of the correlation between floating gate charge and threshold voltage. Two main categories of EEPROM memories are the NOR configuration EEPROM and the NAND configuration EEPROM.

FIG. 5 illustrates a 2×2 array 500 of memory cells in a conventional NOR configuration. Each memory cell has a single floating gate transistor having a control gate terminal coupled to a specific word line, and drain terminal coupled to a specific bit line, and a source terminal coupled to a common source line s1. The floating gate transistor of each EEPROM memory cell is coupled to a unique combination of word and bit lines. For example EEPROM memory cell 511 has a control gate terminal coupled to word line wl1 and a drain terminal coupled to bit line bl1, EEPROM memory cell 512 has a control gate terminal coupled to word line wl1 and a drain terminal coupled to bit line bl2, EEPROM memory cell 521 has a control gate terminal coupled to word line wl2 and a drain terminal coupled to bit line bl1, and EEPROM memory cell 522 has a control gate terminal coupled to word line wl2 and a drain terminal coupled to bit line bl2.

For Channel Hot Electron Injection (CHEI) type NOR memories, a specific bit is programmed into a particular EEPROM memory cell by setting all word lines to ground except for the particular word line connected to the control gate terminal of the particular EEPROM word to be programmed. In addition, all bit lines are set to the same voltage as the source line, except for the bit lines corresponding to the bits to be programmed. The particular word line and bit line of the EEPROM memory cell to be programmed are set to voltages that allow current to flow from the particular bit line, through the channel region of the particular EEPROM memory cell and to the common source line. Some of the channel hot electrons generated penetrate the gate oxide and get trapped in the floating gate. This lowers the voltage of the floating gate thereby increasing the threshold voltage of the memory cell. In other words, a higher voltage is now required on the control gate in order to have the floating gate memory cell conduct significant current.

Prior to programming a specific cell's threshold voltage to a high state, all EEPROM memory cells are erased to a low threshold voltage state. To accomplish this erase operation, a low voltage is placed on all word lines, and a high voltage is placed on all bit lines. The voltage difference is sufficient that the induced electric field forces electrons on the floating gate to penetrate the gate oxide into the channel or drain regions of the transistor for further dissipation, thereby leaving the floating gate of all floating gate transistors with a more positive charge.

In order to read a bit of information stored on a particular EEPROM memory cell, the associated bit line is raised above ground at the same time as the associated word line. The bit line current is then measured. If any of the cells on the chosen bit line are on, current will flow yielding a zero bit. For this reason, it is important the non-programmed (or erased) bits have a positive threshold voltage, yet still lower than the word line read voltage.

There are a number of conventional variations on the illustrated NOR architecture. However, conventional NOR and NAND architectures are typically based on one or more bits of information per floating gate transistor. Accordingly, conventional EEPROM architectures offer compact EEPROM memory cells.

However, in addition to memory size, other key EEPROM memory cell parameters include the program and erase voltage, the program and erase time, data retention, write erase durability. Some memory applications may be less sensitive to memory size, while being more sensitive to performance parameters. Accordingly, what would be advantageous are EEPROM memory cells that provide improved program and erase voltage, program and erase time, data retention, and write erase durability, even if these advantages are obtained with some increase in memory size.

BRIEF SUMMARY OF THE INVENTION

The foregoing problems with the prior state of the art are overcome by the principles of the present invention, which are directed towards an Electrically-Erasable and Programmable Read-Only Memory (EEPROM) memory circuit that includes one or more differential memory cells. Each memory cell includes two floating gate transistors and thus represents some increase in size as compared to conventional EEPROM memory cells that only have one floating gate transistor.

In accordance with a first embodiment of the invention, each floating gate transistor includes a control gate terminal, a floating gate, a source terminal, and a drain terminal. The drain terminal of one floating gate transistor is coupled to one differential bit line, while the drain terminal of the other floating gate transistor is coupled to the other differential bit line. The source terminals of both floating gate transistors are coupled to a common current source or sink. Each of the control gate terminals of each of the floating gate transistors are coupled to a corresponding word line, which may be the same as or different than the corresponding word line that the other control gate in the EEPROM memory cell is connected to.

In accordance with a second embodiment of the invention, each floating gate transistor is a five-terminal device that includes a control gate terminal, a source terminal, a drain terminal, a well terminal, and a body terminal. The floating gate transistor also includes a floating gate which is not considered a terminal. Here, however, a different set of bit lines is used to program the EEPROM memory cell as are used to read the EEPROM memory cell. The drain terminal of one floating gate transistor is coupled to one differential read bit line, while the drain terminal of the other floating gate transistor is coupled to the other differential read bit line. The source terminals of both floating gate transistors are coupled to a common current source or sink. Each of the control gate terminals of each of the floating gate transistors are coupled to a corresponding word line, which may be the same as or different than the corresponding word line that the other control gate in the EEPROM memory cell is connected to. Furthermore, the well terminal of one floating gate transistor is coupled to one differential program bit line, while the well terminal of the other floating gate transistor is coupled to the other differential program bit line.

The principles of the present invention allow for improved performance at the often acceptable expense of a somewhat increased size per EEPROM memory cell. Additional features and advantages of the invention will be set forth in the description that follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The principles of the present invention are directed towards an EEPROM memory cell that includes two floating gate transistors. Each of the drain terminals of each of the transistors is coupled to a corresponding differential bit line. The source terminals of both transistors are coupled to a common current source or sink. Each of the control gate terminals are coupled to a corresponding word line, which may be the same as or different than the corresponding word line that the other control terminal is connected to.

Figure 1A:
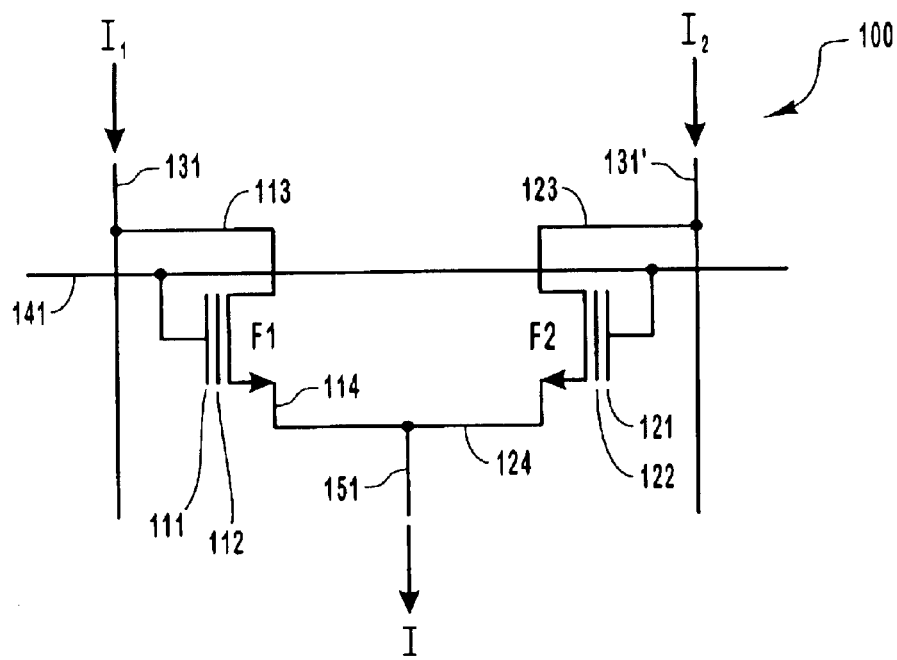
FIG. 1A illustrates a differential EEPROM memory cell in which the drain terminals are connected to corresponding bit lines, the control gate terminals are connected to a common word line, and the source terminals are connected to a common current source or sink.

FIG. 1A illustrates a differential EEPROM memory cell 100 in which the drain terminals are coupled to corresponding bit lines, the control gate terminals are coupled to a common word line, and the source terminals are coupled to a common current source or sink. Specifically, the drain terminal 113 of floating gate transistor F1 is coupled to differential bit line 131, while the drain terminal 113 of floating gate transistor F2 is coupled to differential bit line 131'. Also, the control gate terminal 111 of transistor F1 and the control gate terminal 121 of transistor F2 are both coupled to word line 141. The source terminal 114 of transistor F1 and the source terminal 124 of transistor F2 are coupled to each other and to the current sink 151. Note that while the transistors F1 and F2 are n-type, they may also be p-type in which case any current sources would be current sinks, and vice versa. The memory cell would otherwise be configured the same.

In this description and in the claims, one node in a circuit is "coupled") to another node in the circuit if charge carriers freely flow (even with some resistance) between the two nodes during normal operation of the circuit even without the application of relatively high programming voltages to the nodes. Also in this description and in the claims, one node in a circuit is "capacitively coupled" to another node in the circuit if charge are generally not free to flow between the two nodes, but there is capacitive interaction between the nodes. The one exception is that electrons may flow to some extent between two capacitively coupled nodes due to Fowler-Nordheim tunneling or Channel Hot Electron Injection upon the application of sufficient programming voltages.

In order to program the memory cell 100 with a logical one, the floating gate 112 of transistor F1 is injected with electrons thereby giving the floating gate a more negative charge and thereby increasing the threshold voltage of transistor F1. Also, the floating gate 122 of transistor F2 is discharged of many of its free electrons thereby giving the floating gate a more positive charge and thereby decreasing the threshold voltage of transistor F1. Likewise, in order to program the memory cell 100 with a logical zero, the floating gate 112 of transistor F1 is discharged of many of its free electrons thereby decreasing the threshold voltage of transistor F1, while the floating gate 122 is injected with electrons thereby increasing the threshold voltage of transistor F2.

The net effect of this differential threshold voltage is that if a current I is drawn from the source terminals 114 and 124 of transistors F1 (or provided to the source terminals in the case of p-type transistors), then one current $I_1$ will be different than the other $I_2$. More specifically, a logical one would be manifest by current $I_1$ being lower than current $I_2$. A logical zero would be manifest by current $I_1$ being higher than current $I_2$.

Figure 1B:
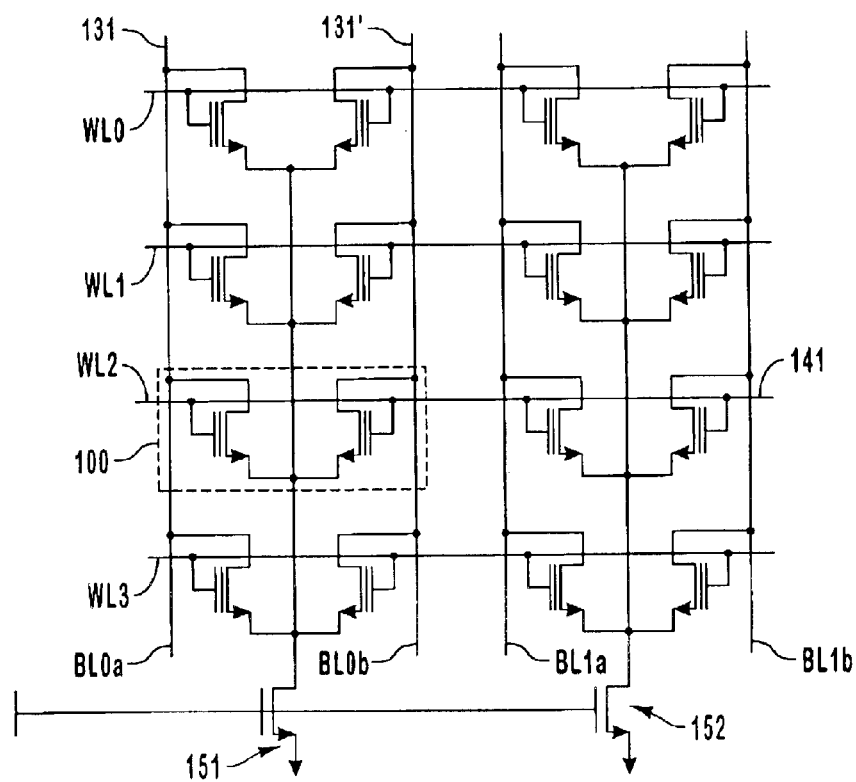
FIG. 1B illustrates a differential EEPROM memory cell array that includes multiple memory cells of the type illustrated in FIG. 1A.

FIG. 1B illustrates the memory cell 100 in the greater context of an array of memory cells. Specifically, the memory cell 100 is represented within the dashed-lined box. The differential bit line 131 is also represented as bit line BL0a, while the differential bit line 131' is also represented as bit line BL0b. Additionally, bit lines BL1a and BL1b support an additional column of memory cells. Furthermore, word line 141 is also represented as word line WL2. The transistors that have their drain terminal connected to a bit line that is identified with an element number having an "a" as a suffix (i.e., the left transistor in each memory cell) will also be referred to as the "a" transistors. Similarly, transistors that have their drain terminal connected to a bit line that is identified with an element number having a "b" as a suffix (i.e., the right transistor in each memory cell) will also be referred to as the "b" transistor.

Figure 6:
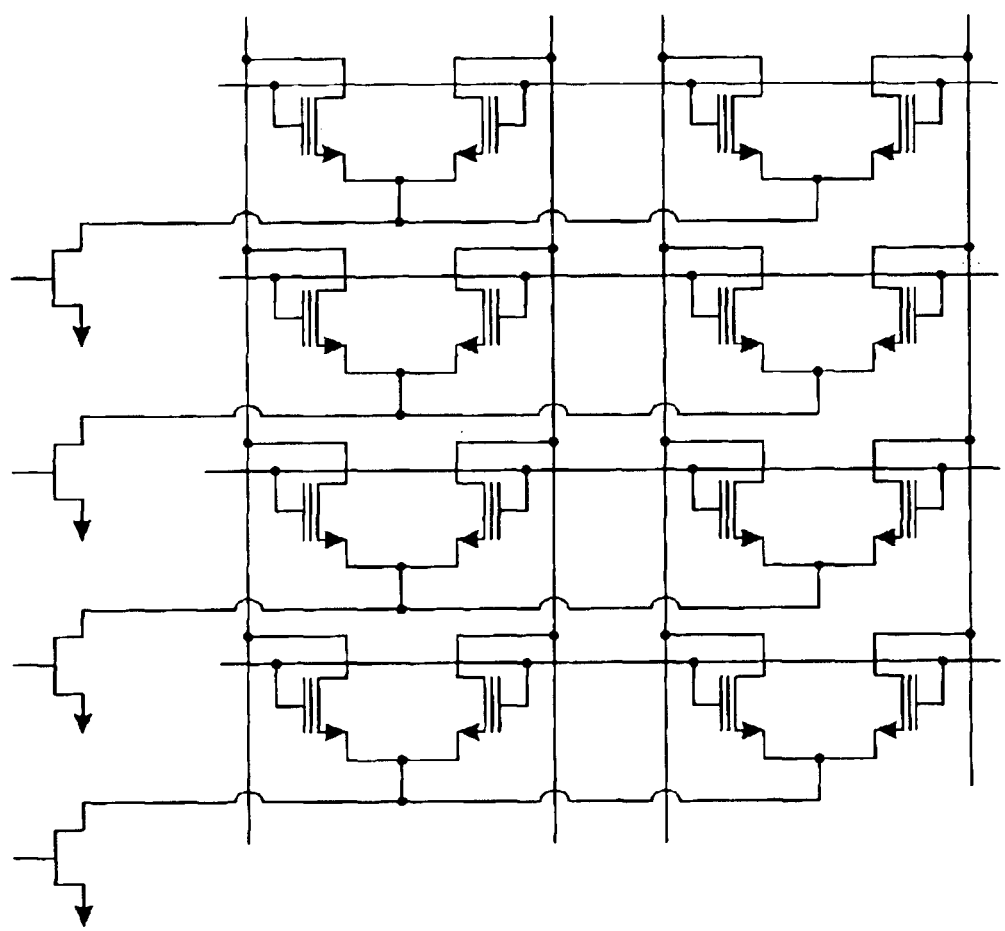
FIG. 6 illustrates a differential EEPROM memory cell array that includes multiple memory cells of the type illustrated in FIG. 1B, except that now the common source of each memory cell is coupled to a common word line.

FIG. 6 illustrates a memory array that is similar to FIG. 1B, except that the common source terminals of each floating gate transistors in a word are coupled in common, with the common node separated from ground via a single pass transistor. This configuration may be desired to protect against an over-erase situation in which the threshold voltage of a floating gate may have been undesirably reduced to less than zero. In that case, the configuration of FIG. 1B may result in a faulty read operation. However, during a read operation for the circuit of FIG. 6, the pass transistor that is coupled to all of the common source terminals of the floating gate transistors in a single word is turned on only when that word is being read. Accordingly, an accurate read operation for a given word will result even if there is an over-erase condition for memory cells outside of that word.

Figure 1C:
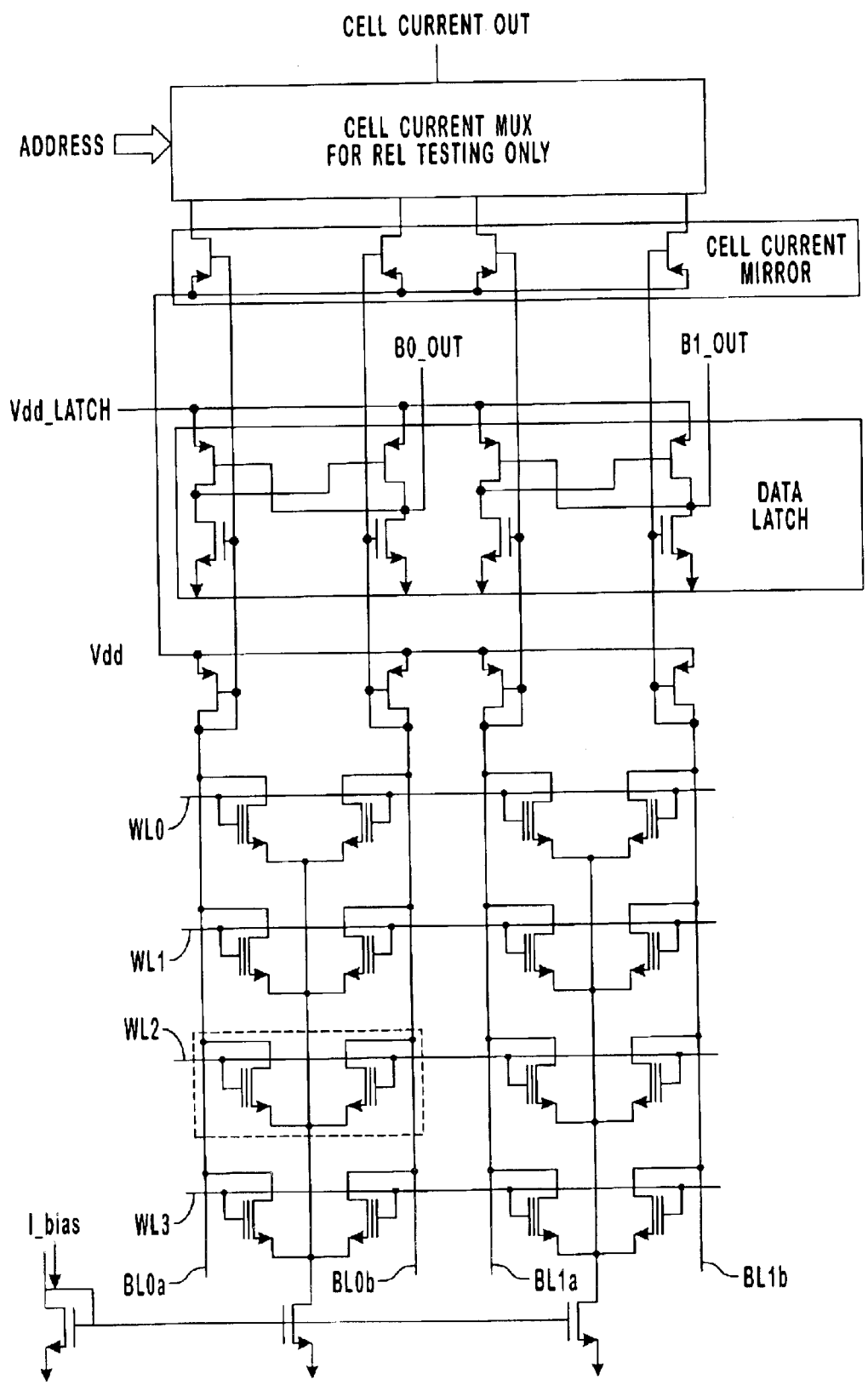
FIG. 1C illustrates a circuit that includes a differential EEPROM memory cell array of FIG. 1B along with supporting circuitry.

FIG. 1C illustrates the memory array of FIG. 1B in the greater context of supporting circuitry that may be used to program, erase, and read the memory cells. In order to read a given word (in this case, a two-bit word comprising bits B0_OUT and B1_OUT), a reference voltage is placed on the corresponding word-line while grounding all other word lines. If the "a" transistor of a given bit has a lower threshold voltage than the "b" transistor of that same bit, the data latch will flip the output node representing that bit to a zero. Similarly, if the "a" transistor of a given bit has a higher threshold voltage than the "b" transistor of that same bit, the data latch will flip the output node representing that bit to a one. To overcome hysteresis in the data latch, the latch supply, Vdd_Latch, can be pulsed to ground and raised to Vdd.

The word programming operation involves two phases. First, all bit lines are grounded and the associated word line is raised to Vpp (the programming voltage) yielding a negative charge on all bits in the associated word. To program Bit B0 to low, the "a" transistor of the associated word which is connected to BL0a needs to have a lower threshold voltage than the "b" transistor connected to BL0b. To accomplish this, a negative voltage, −Vpn may be placed on the associated word line while a positive voltage, Vpp, is placed on BL0a. This converts the charge on the "a" transistor's floating gate from negative to positive. The other differential bit line BL0b may be grounded. If −Vpn is chosen correctly, no significant current will flow from the floating gate of the "b" transistor. Therefore, the floating gate charge of that "b" transistor will remain negative.

As a specific programming example, the second word corresponding to WL2 may be programmed with bit B0 having a logical zero, and bit B1 having a logical one as follows. Word line WL2 is set to a voltage of −Vpn while the other word lines WL0, WL1 and WL3 are grounded. Bit lines BL0a and BL1b are set to Vpp, while bits lines BL0b and BL1a are set to Vpp. This would accomplish programming using Fowler-Nordheim tunneling.

The memory cell in accordance with all embodiments of the present invention has the advantage of having built-in redundancy. Particularly, if the memory cell is programmed such that the transistor having the lower threshold voltage has a net positive charge and the transistor having the higher threshold voltage has a net negative charge, then either transistor may lose its charge (so long as one transistor still has some charge), while still retaining data. Accordingly, data retention is improved significantly over conventional EEPROM memory cells that only include one floating gate transistor.

Figure 2A:
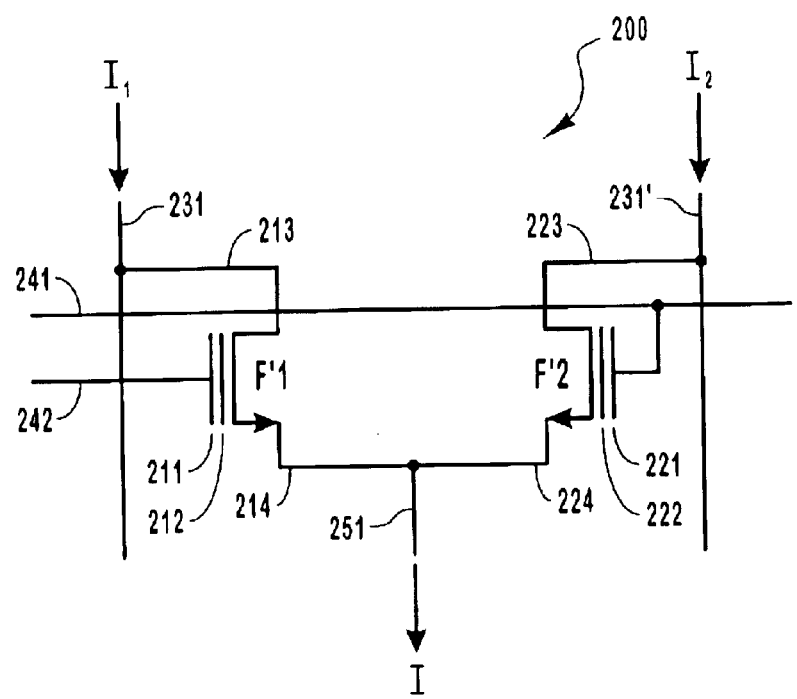
FIG. 2A illustrates a differential EEPROM memory cell which is similar to the EEPROM memory cell illustrated in FIG. 1A, except that the control gates are coupled to different differential word lines.

FIG. 2A illustrates a differential EEPROM memory cell 200 which is similar to the EEPROM memory cell 100 illustrated in FIG. 1A, except that the control gates are coupled to different differential word lines. In this configuration, programming of the low threshold voltage transistor is accomplished using Fowler-Nordheim tunneling, while programming of the high threshold voltage transistor is accomplished using Channel Hot Electron Injection. Additionally, the configuration of FIGS. 2A, 2B, and 2C allow a single bit in a word to be programmed without having to erase and reprogram the entire word.

In FIG. 2A, elements F'1, F'2, 211, 212, 213, 214, 221, 222, 223, 224, 231, 231' and 251 are similar to the corresponding elements F1, F2, 111, 112, 113, 114, 121, 122, 123, 124, 131, 131' and 151 of FIG. 1A. However, in FIG. 2A, there are two word lines 241 and 242 for each word, instead of the one word line 141 of FIG. 1A. The control gate terminal 211 of transistor F'1 is coupled to word line 242, while the control gate terminal 221 of transistor F'2 is coupled to word line 241.

Figure 2B:
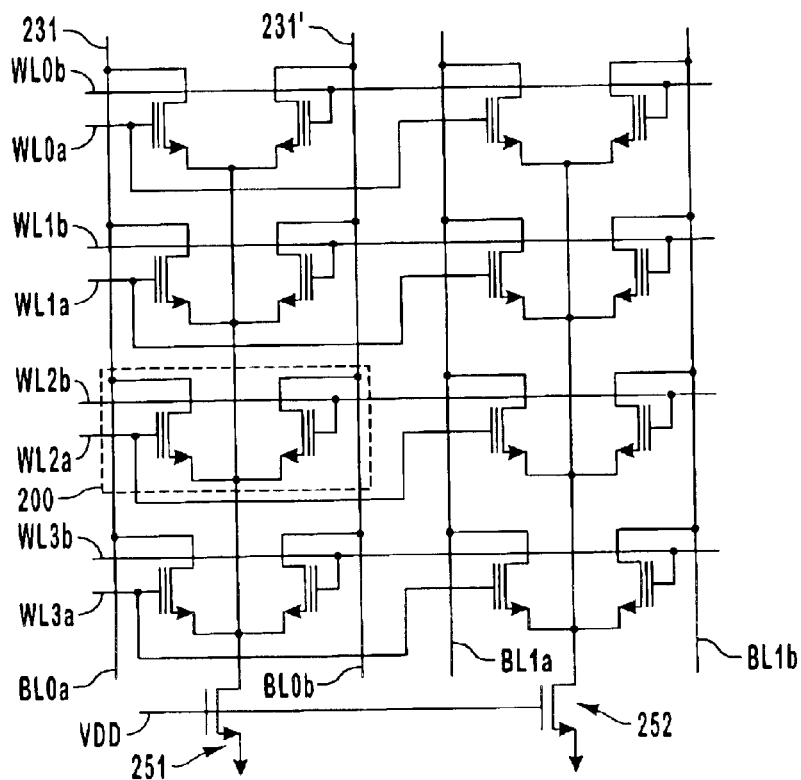
FIG. 2B illustrates a differential EEPROM memory cell array that includes multiple memory cells of the type illustrated in FIG. 2A.

FIG. 2B illustrates a differential EEPROM memory cell array that includes multiple memory cells of the type illustrated in FIG. 2A. In FIG. 2B, differential bit lines 231 and 231' are also labeled bit lines BL0a and BL0b for bit B0 of the corresponding word. Also illustrated are bit lines BL1a and BL2b for corresponding bit B1. The differential word lines 241 and 242 are illustrated as word lines WL2b and WL2a, respectively. Also illustrated are word lines WL0a and WL0b for word 0, word lines WL1a and WL1b for word 1, and word lines WL3a and WL3b for word 3.

Figure 2C:
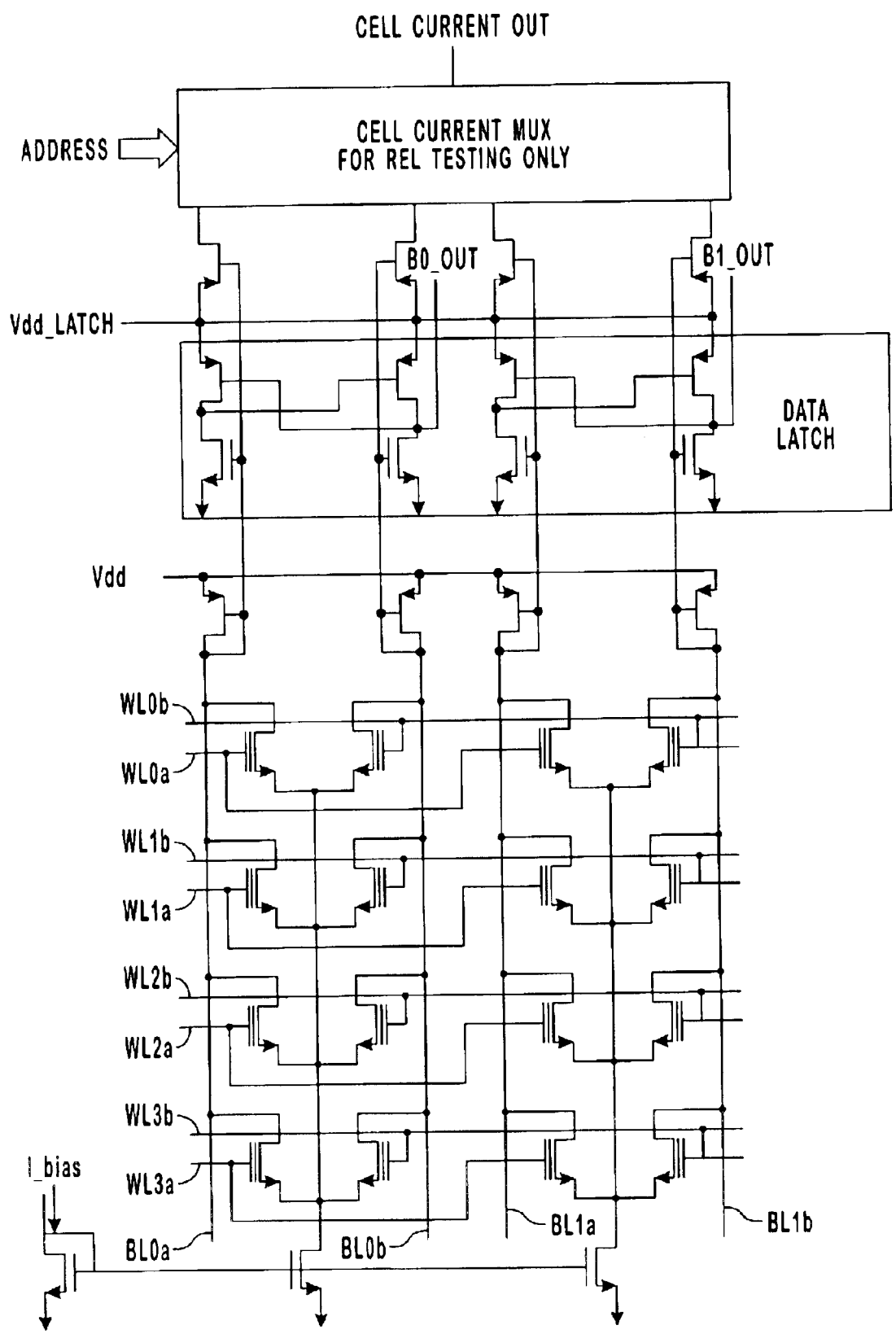
FIG. 2C illustrates a circuit that includes a differential EEPROM memory cell array of FIG. 2B along with supporting circuitry.

FIG. 2C illustrates a circuit that includes a differential EEPROM memory cell array of FIG. 2B along with supporting circuitry such as a data latch, current multiplexer, as well as current mirrors.

The bit represented by memory cell 200 may be programmed without affecting the other bits in the word. In other words, the bit represented at word 2, bit 0 may be programmed without affecting the bit stored at word 2, bit 1. One of the transistors (e.g., the "a" transistor) in the memory cell has a low threshold voltage programmed in the same manner as described above for the memory cell 100 of FIG. 1A. However, the other transistor (e.g., the "b" transistor") is programed to a high threshold voltage with channel hot electron injection. For instance, in order to program word 2 with a bit B0 having a logical 0, and bit B1 having a logical 1, word line WL2a may be set to a negative voltage−Vpn, while word line WL2b is set to a positive voltage Vpp/2. All other word lines are grounded. Bit lines BL0a and BL0b may be set to Vpp, while the bit lines BL1a and BL1b are grounded.

Figure 3A:
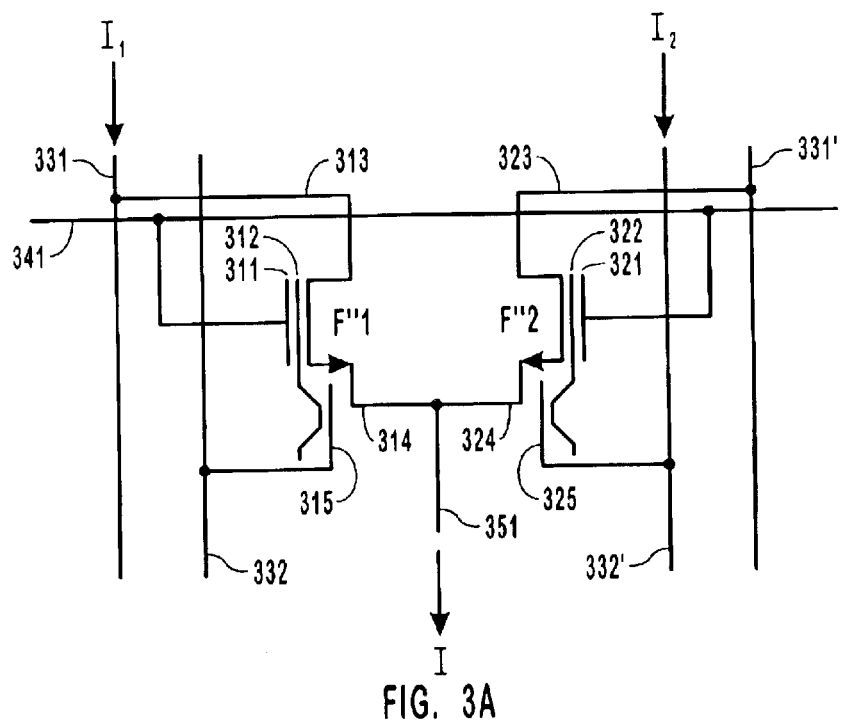
FIG. 3A illustrates a differential EEPROM memory cell that includes two five-terminal terminal floating gate transistors.
Figure 3B:
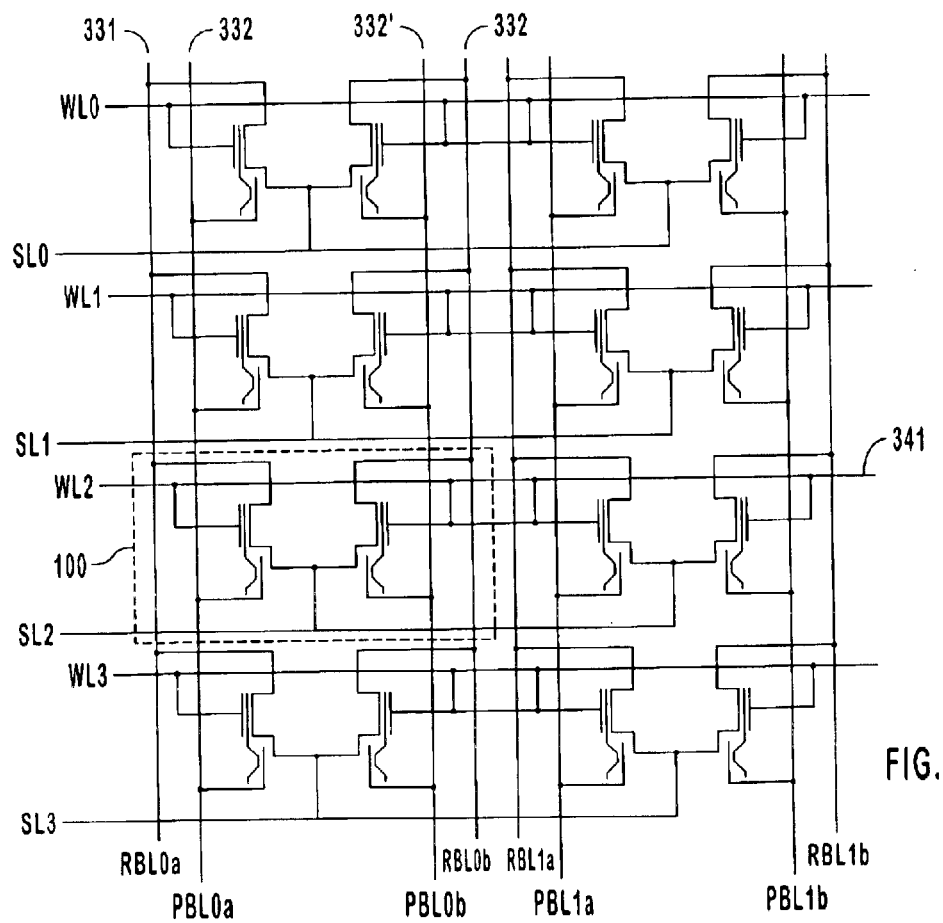
FIG. 3B illustrates a differential EEPROM memory cell array that includes multiple memory cells of the type illustrated in FIG. 3A.
Figure 3C:
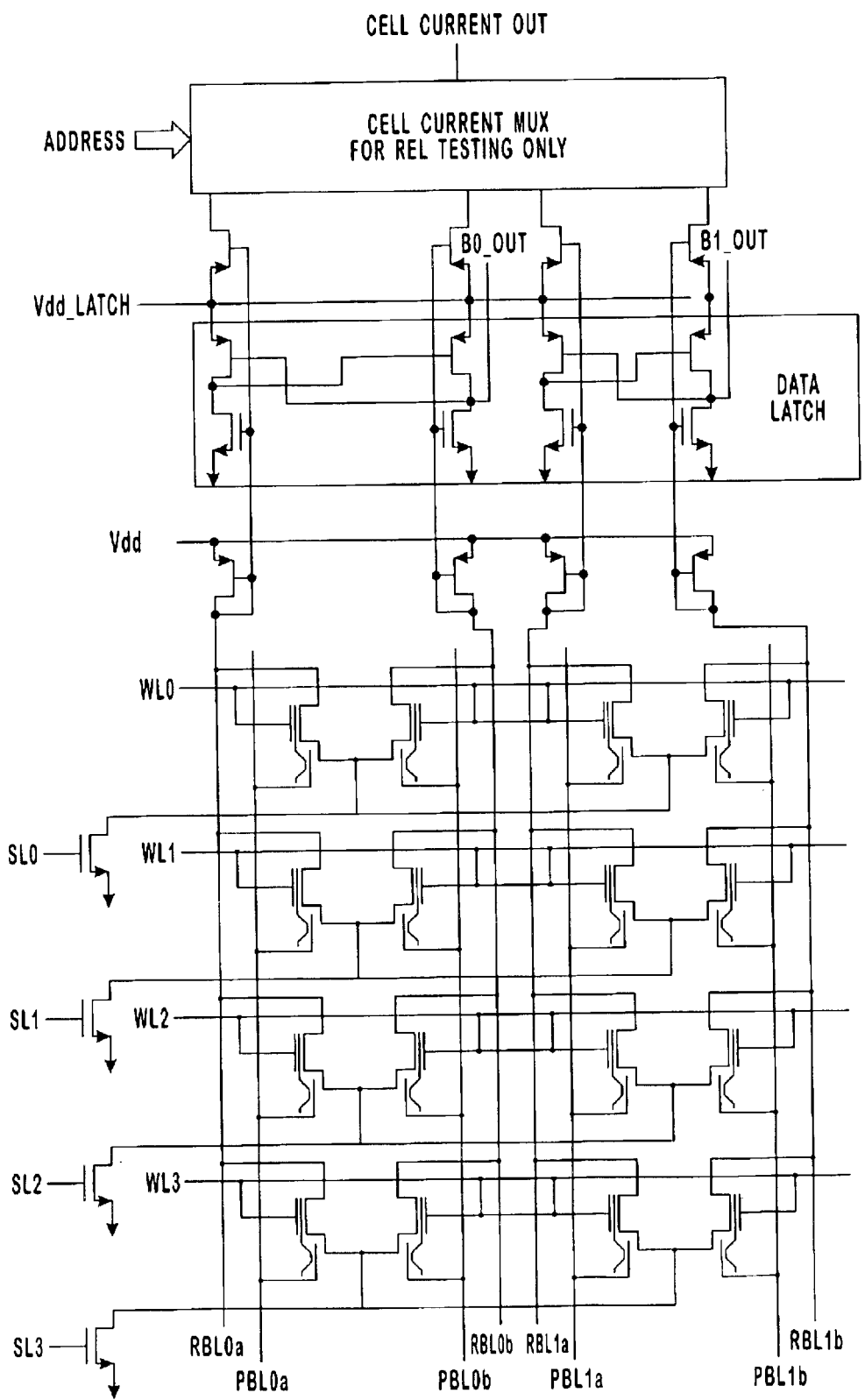
FIG. 3C illustrates a circuit that includes a differential EEPROM memory cell array of FIG. 3B along with supporting circuitry.
Figure 4A:
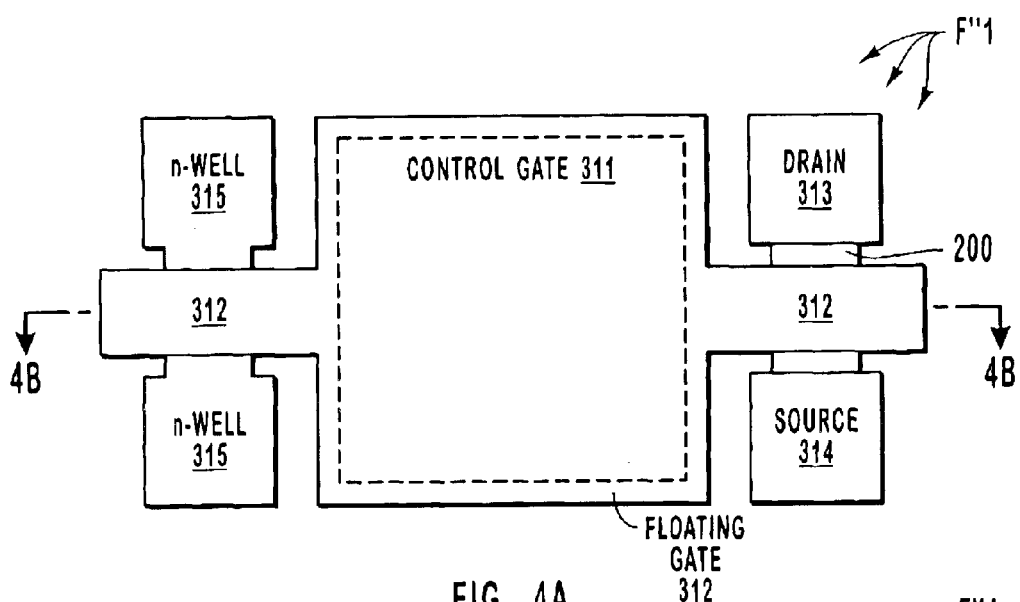
FIG. 4A illustrates a layout view of an n-type five-terminal floating gate transistor that may be used as the floating gate transistor of FIG. 3A.
Figure 4B:
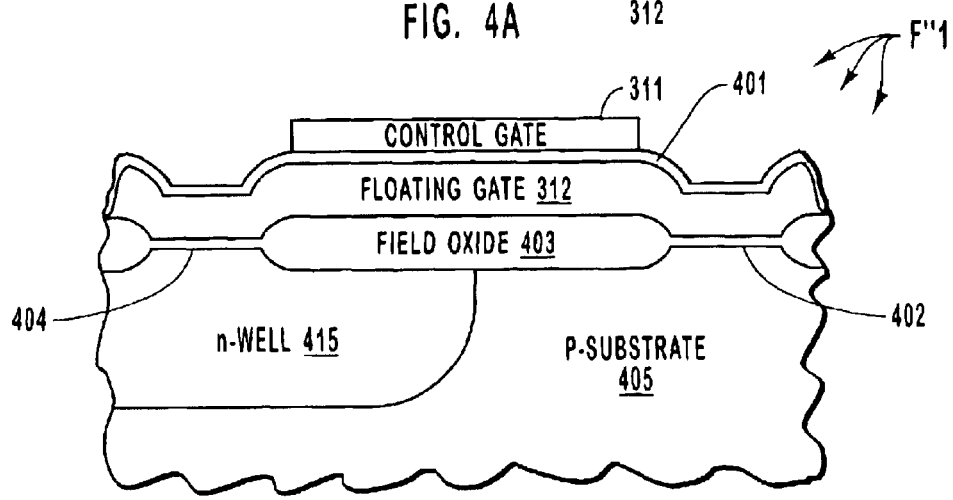
FIG. 4B illustrates a vertical cross-section view of the five-terminal floating gate transistor of FIG. 4A.
Figure 5:
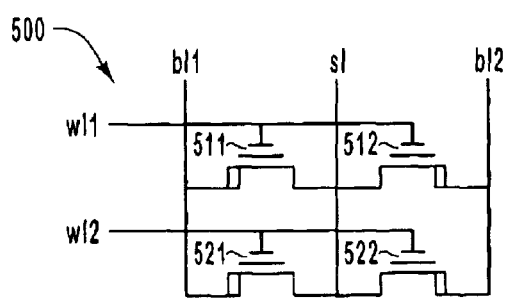
FIG. 5 illustrates a conventional NOR type EEPROM memory array in accordance with the prior art.

FIG. 3A illustrates a differential EEPROM memory cell 300 that includes two five-terminal floating gate transistors. The memory cell 300 is similar to the memory cell 100 of FIG. 1A with some significant differences. In particular, as described with reference to FIGS. 4A and 4B, the structure of the five-terminal floating gate transistors is significantly different than conventional floating gate transistors and includes a fifth terminal called herein a well terminal. Furthermore, a different set of differential bit lines are used to program the memory cell as are used to read the memory cell. FIG. 3B illustrates a differential EEPROM memory cell array that includes multiple memory cells of the type illustrated in FIG. 3A. FIG. 3C illustrates a circuit that includes a differential EEPROM memory cell array of FIG. 3B along with supporting circuitry;

Before describing the operation of the circuits of FIGS. 3A, 3B and 3C, the general structure of a five-terminal floating gate transistor that is suitable for use in these circuits is now described. FIG. 4A illustrates a layout view of an n-type five-terminal floating gate transistor that may be used as the floating gate transistor of FIG. 3A. FIG. 4B illustrates a vertical cross-section view of the five-terminal floating gate transistor of FIG. 4A.

As seen in FIGS. 4A and 4B, n-type five-terminal floating gate transistors F"1 includes a control gate terminal 311, a drain terminal 313, a source terminal 314, a well-terminal 315, and a body terminal (not shown). The floating gate transistors F"1 also includes a floating gate 312. The capacitive coupling between the control gate terminal 311 and the floating gate 312 is strong due to the large area and thin distance between the control gate terminal 311 and the floating gate. Accordingly, since the capacitive coupling between the floating gate 312 and other elements is less significant, any change in the control gate voltage would be almost all reflected in changes in the floating gate voltage. In FIG. 4A, the control gate 311 is bounded by the box with the dashed line boundary, whereas the floating gate 312 is bounded by the solid lined box that has extensions over the well terminal and channel region 400 between the drain terminal 313 and source terminal 314.

The five-terminal floating gate transistor F"1 may be fabricated using standard CMOS processes. For instance, a standard p-type substrate 405 may be used as the foundation. An n-well 415 is formed using standard diffusion processes. An oxide layer having thick field oxide portions 403 and thinner oxides are formed (such as at tunnel window 404 and at portion 402 just above the channel region. After depositing and patterning a floating gate, an oxide layer 401 is then formed over the floating gate. After this, the control gate 311 is deposited and patterned. All of these processes would have occurred elsewhere in the circuitry and with a standard floating gate memory cell. The primary difference is the shape of the patterning masks. Accordingly, the formation of the five-terminal floating gate transistor F"1 involves no additional process steps over that that would normally be required in a standard circuit that employs conventional floating gate technology.

However, due to substantially different patterning, the floating gate not only has a strong capacitive coupling with the channel region of the transistor between the drain and source terminals, but also has some capacitive coupling with the n-well 415. Furthermore, the control gate may overly the channel region in the illustrated embodiment of FIG. 4B. The capacitive coupling between the control gate terminal 411 and the floating gate 412 is strong due to the large area and thin distance between the control gate terminal 411 and the floating gate. Accordingly, since the capacitive coupling between the floating gate 412 and other elements is less significant, any change in the control gate voltage would be almost all reflected in changes in the floating gate voltage. This would allow for more lenient programming voltages.

The second n-type five-terminal floating gate transistor F"2 may be structured similar to the transistor F"1. For instance, transistor F"2 includes a control gate terminal 321, a floating gate 322, a drain terminal 323, a source terminal 324, and a well-terminal 325. A portion of the floating gate 322 has a strong capacitive coupling with the well-terminal 325.

Returning to the memory cell 300 of FIG. 3A, the control gate terminal 311 of five-terminal floating gate transistor F"1 and the control gate terminal 321 of five-terminal floating gate transistor F"2 are coupled to word line 341. The drain terminal 313 of transistor F"1 is coupled to one differential read bit line 331, while the drain terminal 323 of the other transistor F"2 is coupled to the other differential read bit line 331'. The source terminal 314 of transistor F"1 and the source terminal 324 of transistor F"2 are coupled together and to a current sink 351 (or a current source in the case of p-type transistors). Well terminal 315 of transistor F"1 is coupled to one differential program input line 332, while well terminal 325 of transistor F"2 is coupled to the other differential program input line 332'.

FIG. 3B shows the memory cell 300 in the greater context of an array of memory cells. Note that differential read bit lines 331 and 331' are also labeled RBL0a and RBL0b, and the differential program bit lines 332 and 332' are also labeled PBL0a and PBL0b, for bit B0 in each word. The four other differential bit lines (two for reading and two for programming) for column 1 are also shown as RBL1a, RBL1b, PBL1a and PBL1b. Also, word line 341 is also labeled WL2. Other word lines WL0, WL1 and WL2 are also shown. Illustrated in FIG. 3C is a data latch, as well as select transistors receiving voltages SL0, SL1, SL2, and SL3 at their gate terminals and that are used to select words 0, 1, 2 and 3, respectively.

The use of the five-terminal floating gate transistors allows the well terminal to simplify programming and erasing. Here, only one step is needed thereby significantly shortening the programming and erasing time. An intermediate voltage Vpp/2 is generated and placed on the word lines of all words not to be programmed. The data is then set on the program bit lines. The word line of the word to be programmed is then pulsed from Vpp/2, which is the normal static state, to Vpp, then to ground. The read bit lines and the current sink are set to Vdd. In order to program word 2 with a bit B0 having a logical zero and bit B1 having a logical one, for example, word lines WL0, WL1, and WL3 would be set to Vpp/2. Word line WL2 would be pulse from Vpp/2 to Vpp and then to ground. All read bit lines RBL0a, RBL0b, RBL1a and RBL1b are set to Vdd to reduce write corruption in non-programmed bits. Program bit lines PBL0a and PBL1b are set to Vpp while program bit lines PBL0b and PBL1a are grounded.

As one additional embodiment, the embodiment of FIG. 3A, 3B, and 3C could be modified such that the "a" transistor in each memory cell has a control gate that is coupled to a different word line than the control gate of the "b" transistor in that same memory cell. This would once again allow for the programming of a single bit in a word, without reprogramming the entire word. In addition to built in redundancy, the embodiments of FIGS. 3A, 3B, and 3C allow for reduced programming and erase voltages and times.

Although the principles of the present invention have been described with respect to specific embodiments, various additions, modifications, and deletions will be apparent to one of ordinary skill in the art after having read this description. For example, some memory cells may be p-type memory cells having p-type five-terminal floating gate transistors, and others may be n-type memory cells having n-type five-terminal floating gate transistors. Furthermore, some of the memory cells may be as described with respect to one embodiment, while other may be as described with respect to another embodiment, while yet others are conventional EEPROM memory cells. In addition, some memory cells may share a current mirror and/or a data latch with other memory cells, while others may have their own current mirror and/or data latch.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes, which come within the meaning and range of equivalency of the claims, are to be embraced within their scope.

What is claimed and desired secured by United States Letters Patent is:

1. A differential Electrically-Erasable and Programmable Read-Only Memory (EEPROM) memory in which a memory cell comprises:

a first floating gate transistor comprising a first control gate terminal, a first floating gate, a first source terminal, and a first drain terminal, the first drain terminal coupled to a first differential bit line, the first control gate terminal coupled to a first word line, the first source terminal coupled to a current source or sink; and a second floating gate transistor comprising a second control gate terminal, a second floating gate, a second source terminal, and a second drain terminal, the second drain terminal coupled to a second differential bit line, the second control gate terminal coupled to a second word line, the second source terminal coupled to the current source or sink, wherein the memory further comprises a circuit component configured to identify a binary bit stored by the memory cell depending on which of the first or second floating gate transistors draws more current during a read operation.

2. An EEPROM memory in accordance with claim 1, wherein the first and second word lines are the same word line.

3. An EEPROM memory in accordance with claim 1, wherein the first and second word lines are different word lines.

4. An EEPROM memory in accordance with claim 1, wherein the first and second floating gate transistors are n-type and the current source or sink is a current sink.

5. An EEPROM memory in accordance with claim 1, wherein the first and second floating gate transistors are p-type and the current source or sink is a current source.

6. A differential Electrically-Erasable and Programmable Read-Only Memory EEPROM memory cell comprising the following:

a first five-terminal floating gate transistor comprising a first control gate terminal, a first floating gate, a first source terminal, a first drain terminal, and a first well terminal, the first drain terminal coupled to a first differential read bit line, the first well terminal coupled to a first differential program bit line, the first control gate terminal coupled to a first word line, the first source terminal coupled to a current source or sink; and a second five-terminal floating gate transistor comprising a second control gate terminal, a second floating gate, a second source terminal, a second drain terminal, and a second well terminal, the second drain terminal coupled to a second differential read bit line, the second well terminal coupled to a second differential program bit line, the second control gate terminal coupled to a second word line, the second source terminal coupled to the current source or sink.

7. An EEPROM memory cell in accordance with claim 6, wherein the first and second word lines are the same word line.

8. An EEPROM memory cell in accordance with claim 6, wherein the first and second word lines are different word lines.

9. An EEPROM memory cell in accordance with claim 6, wherein the first and second floating gate transistors are n-type and the current source or sink is a current sink.

10. An EEPROM memory cell in accordance with claim 9, wherein the first well terminal is n-type.

11. An EEPROM memory cell in accordance with claim 10, wherein the second well terminal is n-type.

12. An EEPROM memory cell in accordance with claim 9, wherein the first well terminal is p-type.

13. An EEPROM memory cell in accordance with claim 12, wherein the second well terminal is n-type.

14. An EEPROM memory cell in accordance with claim 9, wherein the first and second well terminals are p-type.

15. An EEPROM memory cell in accordance with claim 6, wherein the first and second floating gate transistors are n-type and the current source or sink is a current sink.

16. An EEPROM memory cell in accordance with claim 6, wherein the first and second floating gate transistors are p-type and the current source or sink is a current source.

17. An EEPROM memory cell in accordance with claim 6, wherein the first well terminal is p-type.

18. An EEPROM memory cell in accordance with claim 16, wherein the second well terminal is p-type.

19. An EEPROM memory cell in accordance with claim 16, wherein the second well terminal is n-type.

20. An EEPROM memory cell in accordance with claim 16, wherein the first and second well terminals are p-type.

* * * * *

UNITED STATES PATENT AND TRADEMARK OFFICE
CERTIFICATE OF CORRECTION

PATENT NO. : 6,765,825 B1
APPLICATION NO. : 10/387824
DATED : July 20, 2004
INVENTOR(S) : Greg Scott It is certified that error appears in the above-identified patent and that said Letters Patent is hereby corrected as shown below:

Title Page
Item 57, ABSTRACT, line 4, change "terminal" to --terminals--
Item 57, ABSTRACT, line 11, after "memory cell" change "as" to --than--

Column 4
Line 63, after "drain terminal" change "113" to --123--

Column 5
Line 8, change ""coupled")" to --"coupled"--

Column 6
Line 43, before "lines BL0b" change "bits" to --bit--

Column 7
Line 55, after "supporting circuitry" change ";" to --.--

Column 8
Line 28, after "steps over" change "that that" to --that which--

Signed and Sealed this

Twenty-sixth Day of September, 2006

JON W. DUDAS
*Director of the United States Patent and Trademark Office*